US009148105B2

(12) United States Patent
Springfield et al.

(10) Patent No.: US 9,148,105 B2
(45) Date of Patent: Sep. 29, 2015

(54) SMART UN-MUTING BASED ON SYSTEM EVENT WITH SMOOTH VOLUME CONTROL

(75) Inventors: Randall Scott Springfield, Chapel Hill, NC (US); Ephraim D. Starr, Palos Verdes Estates, CA (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 600 days.

(21) Appl. No.: 13/004,080

(22) Filed: Jan. 11, 2011

(65) Prior Publication Data

US 2012/0177225 A1 Jul. 12, 2012

(51) Int. Cl.
H03G 3/00 (2006.01)
H03G 3/34 (2006.01)

(52) U.S. Cl.
CPC ....................................... H03G 3/34 (2013.01)

(58) Field of Classification Search
USPC .................... 381/94.5, 104–107, 109; 700/94
See application file for complete search history.

(56) References Cited

U.S. PATENT DOCUMENTS

| 7,620,166 | B2* | 11/2009 | Cadiz et al. ............. 379/207.02 |
| 7,706,903 | B2* | 4/2010 | Champion et al. ............. 700/94 |
| 7,911,983 | B2* | 3/2011 | Patel et al. ..................... 370/259 |
| 7,986,233 | B2* | 7/2011 | Wehrenberg .................. 340/571 |
| 2004/0102861 | A1* | 5/2004 | Han .................................. 700/94 |
| 2004/0246121 | A1* | 12/2004 | Beyda ........................... 340/506 |
| 2005/0063556 | A1* | 3/2005 | McEachen et al. ........... 381/104 |
| 2005/0193232 | A1* | 9/2005 | Diehl ................................ 714/5 |
| 2006/0285701 | A1* | 12/2006 | Chumbley et al. ............ 381/104 |
| 2010/0241837 | A1* | 9/2010 | Concorso .......................... 713/2 |
| 2011/0023331 | A1* | 2/2011 | Kolodjski et al. ............... 36/139 |

* cited by examiner

Primary Examiner — Joseph Saunders, Jr.
Assistant Examiner — James Mooney
(74) Attorney, Agent, or Firm — John L. Rogitz; John M. Rogitz

(57) ABSTRACT

An approach is provided that receives an audio request from a request source while an information handling machine, such as a computer system, is in a muted state. The request source is compared with a list of one more un-mute sources stored in a memory. If the comparison reveals that the request source is included in the list of un-mute sources, then the audio request is audibly played.

20 Claims, 8 Drawing Sheets

SMART UN-MUTING BASED ON SYSTEM EVENT WITH SMOOTH VOLUME CONTROL

BACKGROUND

The present disclosure provides an approach that un-mutes system sounds based upon the system event to which they are related. The present disclosure further provides a smooth increase of audio volume for such system events.

Users of personal computers and other devices with audio capabilities enjoy many benefits associated with a mute function. For example, the mute function provides the ability to lower or shut off volume promptly and/or with one touch of a button or similar command. A mute function also provides the capability to override audio in circumstances such as initial powering-on or waking of a device. However, the traditional mute function can also lead to difficulties or annoyances. For example, when a mute function is active (as it commonly is in the workplace environment or in the home setting when children are asleep), it can be annoying for the user to have to un-mute the device when, based on the user performing a certain action, the context indicates that the user most probably intends for the device's audio to be audible. This can occur, for example, during video teleconferences. Conversely, if the mute function is not active, the device may play unintended and/or disruptive audio upon the occurrence of certain events, such as power-on, wake, automated connection to certain web sites and the like.

SUMMARY

An approach is provided that receives an audio request from a request source while an information handling machine, such as a computer system, is in a muted state. The request source is compared with a list of one or more un-mute sources stored in a memory. If the comparison reveals that the request source is included in the list of un-mute sources, then the audio request is audibly played.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages, will become apparent in the non-limiting detailed description set forth below.

BRIEF DESCRIPTION OF THE DRAWINGS

Embodiments described herein may be better understood by referencing the accompanying drawings, wherein.

DETAILED DESCRIPTION

Certain specific details are set forth in the following description and figures to provide a thorough understanding of various embodiments. Certain well-known details often associated with computing and software technology are not set forth in the following disclosure, however, to avoid unnecessarily obscuring the various embodiments. Further, those of ordinary skill in the relevant art will understand that they can practice other embodiments without one or more of the details described below. Finally, while various methods are described with reference to steps and sequences in the following disclosure, the description as such is for providing a clear implementation of embodiments, and the steps and sequences of steps should not be taken as required to practice this invention. Instead, the following is intended to provide a detailed description of an example of the invention and should not be taken to be limiting of the invention itself. Rather, any number of variations may fall within the scope of the invention, which is defined by the claims that follow the description.

The following detailed description will generally follow the summary, as set forth above, further explaining and expanding the definitions of the various aspects and embodiments as necessary. To this end, this detailed description first sets forth a computing environment in FIG. 1 that is suitable to implement the software and/or hardware techniques associated with the embodiments. A networked environment is illustrated in FIG. 2 as an extension of the basic computing environment, to emphasize that modern computing techniques can be performed across multiple discrete devices.

Figure 1:
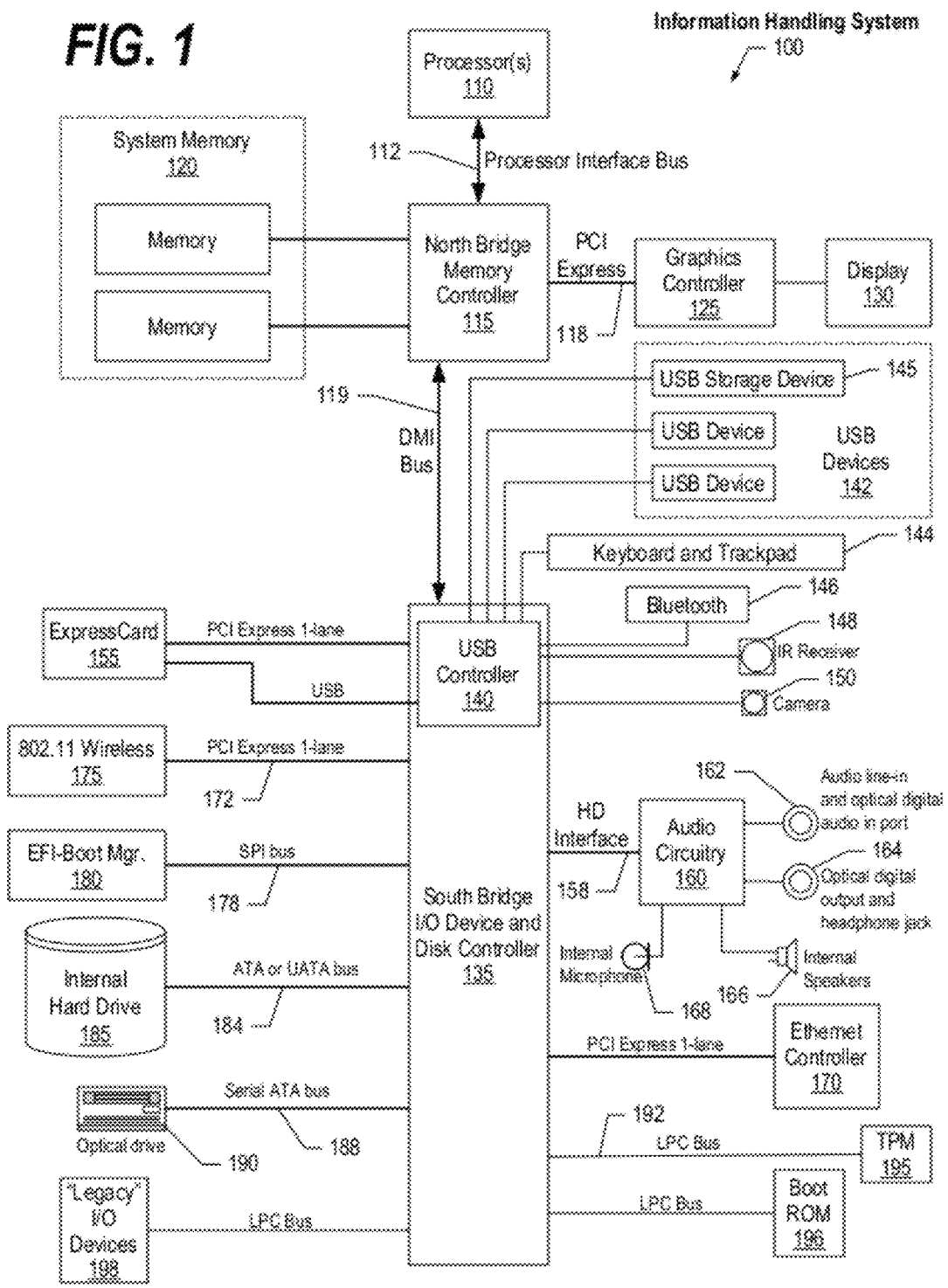
FIG. 1 is a block diagram of a data processing system in which the methods described herein can be implemented.
Figure 2:
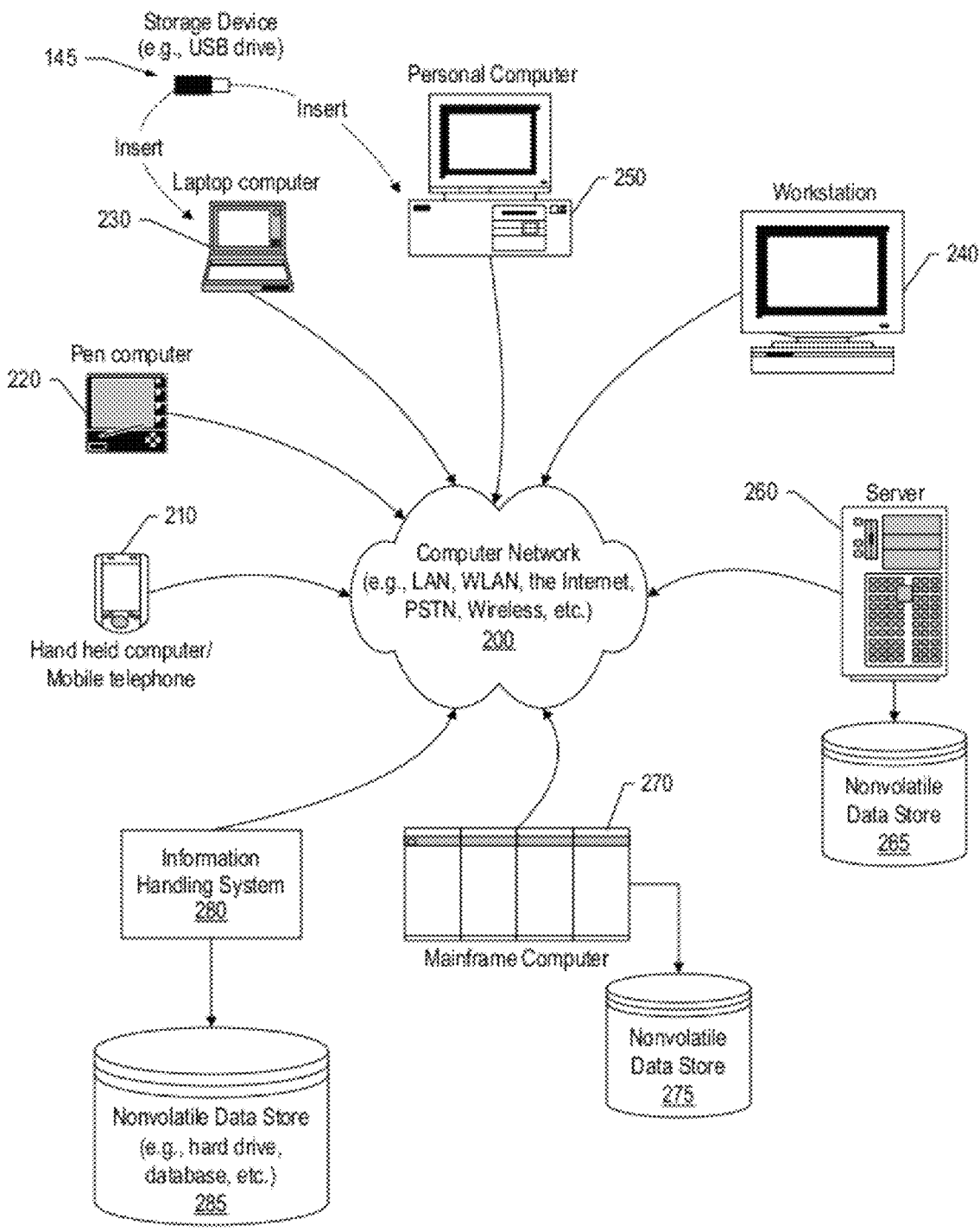
FIG. 2 provides an extension of the information handling system environment shown in FIG. 1 to illustrate that the methods described herein can be performed on a wide variety of information handling systems which operate in a networked environment.

FIG. 1 illustrates information handling system 100, which is a simplified example of a computer system capable of performing the computing operations described herein. Information handling system 100 includes one or more processors 110 coupled to processor interface bus 112. Processor interface bus 112 connects processors 110 to Northbridge 115, which is also known as the Memory Controller Hub (MCH). Northbridge 115 connects to system memory 120 and provides a means for processor(s) 110 to access the system memory. Graphics controller 125 also connects to Northbridge 115. In one embodiment, PCI Express bus 118 connects Northbridge 115 to graphics controller 125. Graphics controller 125 connects to display device 130, such as a computer monitor.

Northbridge 115 and Southbridge 135 connect to each other using bus 119. In one embodiment, the bus is a Direct Media Interface (DMI) bus that transfers data at high speeds in each direction between Northbridge 115 and Southbridge 135. In another embodiment, a Peripheral Component Interconnect (PCI) bus connects the Northbridge and the Southbridge. Southbridge 135, also known as the I/O Controller Hub (ICH) is a chip that generally implements capabilities that operate at slower speeds than the capabilities provided by the Northbridge. Southbridge 135 typically provides various busses used to connect various components. These busses include, for example, PCI and PCI Express busses, an ISA bus, a System Management Bus (SMBus or SMB), and/or a Low Pin Count (LPC) bus. The LPC bus often connects low-bandwidth devices, such as boot ROM 196 and "legacy" I/O devices (using a "super I/O" chip). The "legacy" I/O devices (198) can include, for example, serial and parallel ports, keyboard, mouse, and/or a floppy disk controller. The LPC bus also connects Southbridge 135 to Trusted Platform Module (TPM) 195. Other components often included in Southbridge 135 include a Direct Memory Access (DMA) controller, a Programmable Interrupt Controller (PIC), and a storage device controller, which connects Southbridge 135 to nonvolatile storage device 185, such as a hard disk drive, using bus 184.

ExpressCard 155 is a slot that connects hot-pluggable devices to the information handling system. ExpressCard 155 supports both PCI Express and USB connectivity as it connects to Southbridge 135 using both the Universal Serial Bus (USB) the PCI Express bus. Southbridge 135 includes USB Controller 140 that provides USB connectivity to devices that connect to the USB. These devices include webcam (camera) 150, infrared (IR) receiver 148, keyboard and trackpad 144, and Bluetooth device 146, which provides for wireless personal area networks (PANs). USB Controller 140 also provides USB connectivity to other miscellaneous USB connected devices 142, such as a mouse, removable nonvolatile storage device 145, modems, network cards, ISDN connectors, fax, printers, USB hubs, and many other types of USB connected devices. While removable nonvolatile storage device 145 is shown as a USB-connected device, removable nonvolatile storage device 145 could be connected using a different interface, such as a Firewire interface, etcetera.

Wireless Local Area Network (LAN) device 175 connects to Southbridge 135 via the PCI or PCI Express bus 172. LAN device 175 typically implements one of the IEEE 802.11 standards of over-the-air modulation techniques that all use the same protocol to wireless communicate between information handling system 100 and another computer system or device. Extensible Firmware Interface (EFI) manager 180 connects to Southbridge 135 via Serial Peripheral Interface (SPI) bus 178 and is used to interface between an operating system and platform firmware. Optical storage device 190 connects to Southbridge 135 using Serial ATA (SATA) bus 188. Serial ATA adapters and devices communicate over a high-speed serial link. The Serial ATA bus also connects Southbridge 135 to other forms of storage devices, such as hard disk drives. Audio circuitry 160, such as a sound card, connects to Southbridge 135 via bus 158. Audio circuitry 160 also provides functionality such as audio line-in and optical digital audio in port 162, optical digital output and headphone jack 164, internal speakers 166, and internal microphone 168. Ethernet controller 170 connects to Southbridge 135 using a bus, such as the PCI or PCI Express bus. Ethernet controller 170 connects information handling system 100 to a computer network, such as a Local Area Network (LAN), the Internet, and other public and private computer networks.

While FIG. 1 shows one information handling system, an information handling system may take many forms. For example, an information handling system may take the form of a desktop, server, portable, laptop, notebook, mobile internet device, or other form factor computer or data processing system. In addition, an information handling system may take other form factors such as a personal digital assistant (PDA), a gaming device, ATM machine, a portable telephone device, a communication device or other devices that include a processor and memory.

FIG. 2 provides an extension of the information handling system environment shown in FIG. 1 to illustrate that the methods described herein can be performed on a wide variety of information handling systems that operate in a networked environment. Types of information handling systems range from small handheld devices, such as handheld computer/mobile telephone 210 to large mainframe systems, such as mainframe computer 270. Examples of handheld computer 210 include personal digital assistants (PDAs), personal entertainment devices, such as MP3 players, portable televisions, and compact disc players. Other examples of information handling systems include pen, or tablet, computer 220, laptop, or notebook, computer 230, workstation 240, personal computer system 250, and server 260. Other types of information handling systems that are not individually shown in FIG. 2 are represented by information handling system 280. As shown, the various information handling systems can be networked together using computer network 200. Types of computer network that can be used to interconnect the various information handling systems include Local Area Networks (LANs), Wireless Local Area Networks (WLANs), the Internet, the Public Switched Telephone Network (PSTN), other wireless networks, and any other network topology that can be used to interconnect the information handling systems. Many of the information handling systems include nonvolatile data stores, such as hard drives and/or nonvolatile memory. Some of the information handling systems shown in FIG. 2 depicts separate nonvolatile data stores (server 260 utilizes nonvolatile data store 265, mainframe computer 270 utilizes nonvolatile data store 275, and information handling system 280 utilizes nonvolatile data store 285). The nonvolatile data store can be a component that is external to the various information handling systems or can be internal to one of the information handling systems. In addition, removable nonvolatile storage device 145 can be shared among two or more information handling systems using various techniques, such as connecting the removable nonvolatile storage device 145 to a USB port or other connector of the information handling systems.

Figure 3:
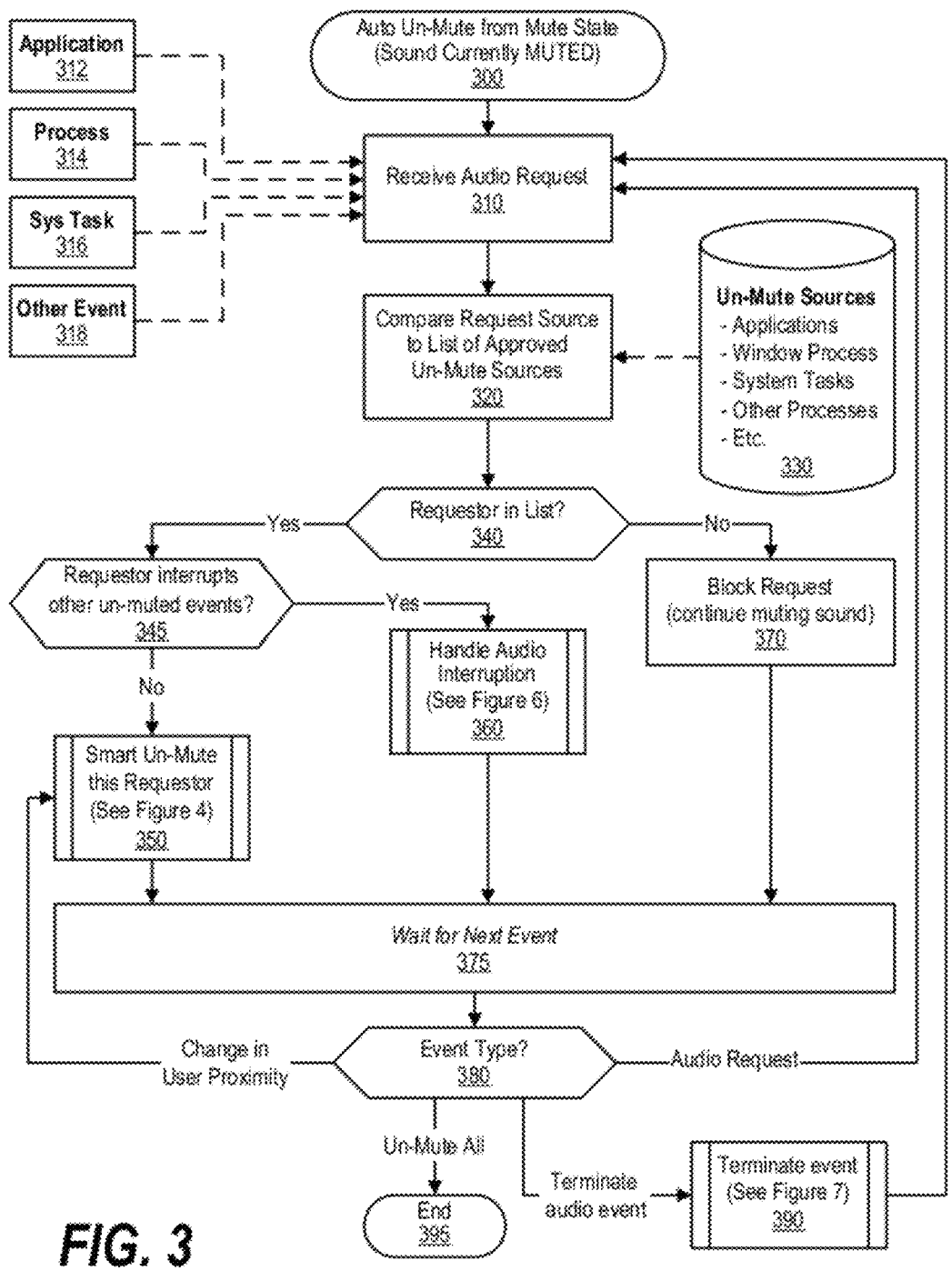
FIG. 3 is a flowchart showing an approach that automatically un-mutes audio from a mute state based on a source of the audio.

FIG. 3 is a flowchart showing an approach that automatically un-mutes audio from a mute state based on a source of the audio. Processing commences at 300 whereupon, at step 310, an audio request is received from a request source such as application program 312, software process 314, system task 316, or other event 318. Other event request source 318 may include a particular file type or application program type. Examples of other event 318 may also include a single- or double-click event occurring in conjunction with an associated resource such as an application, file, or web page icon, button, or link. At step 320, the request source is compared to a list of one or more approved un-mute sources stored in a memory (data store 330). A decision is made as to whether the request source is in the list of approved un-mute sources (decision 340). If the request source is in the list of approved un-mute sources, then decision 340 branches to the "yes" branch whereupon a decision is made as to whether this particular request source is a sole user of the audio system that interrupts the use of the audio system by other un-muted events (decision 345). For example, a voice-over-Internet-protocol (VoIP) application may be listed as a sole user of the audio system so that other un-muted sources are muted while the VoIP session is taking place so as to not interrupt the conversation taking place in the VoIP session. If the requestor does not interrupt other un-muted events, then decision 345 branches to the "no" branch whereupon, at predefined process 350, the system un-mutes the requestor (see FIG. 4 and corresponding text for processing details). On the other hand, if the requestor interrupts other un-muted events in order to be the sole audio event that is playing, then decision 345 branches to the "yes" branch whereupon, at predefined process 360, the audio interruption is handled, such as handling a VoIP session as previously discussed (see FIG. 6 and corresponding text for processing details). Returning to decision 340, if the request source is not in the list of approved un-mute sources, then decision 340 branches to the "no" branch whereupon, at step 370, the audio request is blocked thereby muting the sound being requested by the request source.

At step 375, the system waits for the next event to occur. A decision is made as to the type of event that occurs (decision 380). In one embodiment, a proximity sensor is used to sense the proximity of a user to the system in order to increase the volume when the user is near (proximate to) the system and decrease the volume when the user is away from (not proximate to) the system. In this embodiment, an event type can be a change in user proximity. When this occurs, decision 380 branches to the "change in user proximity" branch which loops back to process the proximity change, the steps of which are detailed in predefined process 350 (see FIG. 4 and corresponding text for processing details). Another event can be another incoming audio request. When another incoming audio event is received, decision 380 branches to the "audio request" branch which loops back to step 310 to receive and process the audio request. Another event can be the termination of an audio event or source thereof. When an audio event, such as the termination of a VoIP application, the termination of a multimedia application, etc. occurs, then decision 380 branches to the "terminate audio event" branch whereupon predefined process 390 is performed to terminate the event with the audio un-mute system (see FIG. 7 and corresponding text for processing details). Finally, when an event type is to un-mute all sounds or to otherwise shutdown the system, then decision 380 branches to the "un-mute all" branch whereupon the automatic un-mute processing terminates at 395.

Figure 4:
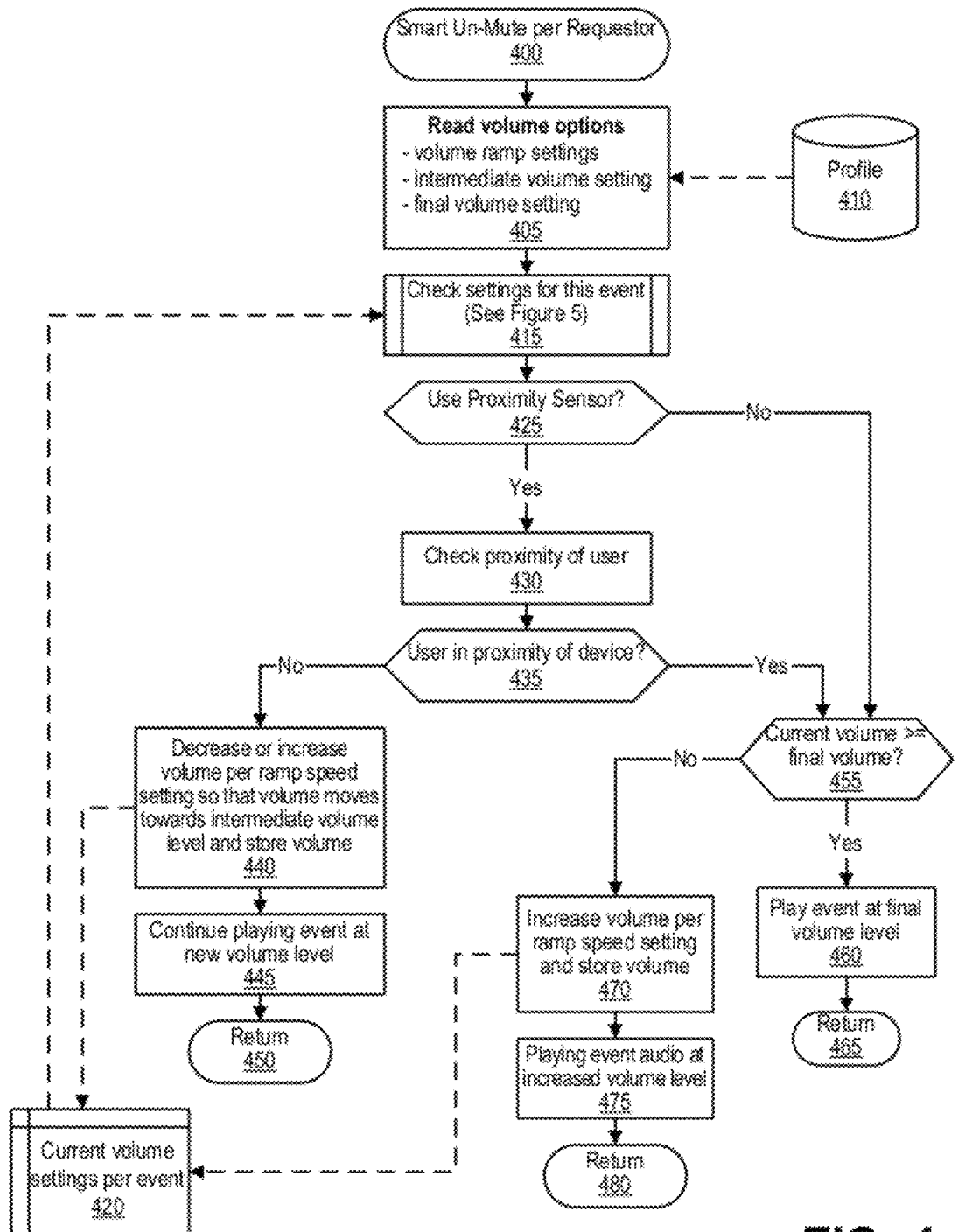
FIG. 4 is a flowchart showing steps taken to un-mute an audio requestor.

FIG. 4 is a flowchart showing steps taken to un-mute an audio requestor. Processing commences at 400 whereupon, at step 405, volume options are read from profile 410. Volume options may include volume ramp settings (e.g., how fast a volume is ramped from muted to a higher volume level), intermediate volume setting (e.g., a volume to play sounds at when the user is away from (not proximate to) the system, and a final volume setting (e.g., a final volume level to eventually play sounds at when the user is proximate to the system after the volume has been ramped up according to the volume ramp setting). At predefined process 415, the settings for the particular event (this request source) are checked by reading current volume settings memory area 420 (see FIG. 5 and corresponding text for processing details). A decision is made as to whether a proximity sensor is being used by the system (decision 425). If a proximity sensor is being used by the system, then decision 425 branches to the "yes" branch whereupon, at step 430, the system checks the proximity of the user in relation to the computer system using the proximity sensor. A decision is made as to whether the user is in proximity to the system (decision 435). If the user is not in proximity to the system, then decision 435 branches to the "no" branch whereupon, at step 440, the volume is increased or decreased according to the volume ramp setting toward the intermediate volume setting and the new volume level is stored in current volume settings memory area 420. So, if the current volume level was above the intermediate volume level and the user walks away from the system, then, at step 440, the volume would be decreased according to the volume ramp settings until the volume is eventually reduced to the intermediate volume level. On the other hand, if the current volume level was below the intermediate volume level, then the volume would be increased until the volume is eventually raised to the intermediate volume level. At step 445, the audio request (event) is played at the new (increased or decreased) volume level. Processing then returns to the calling routine (see FIG. 3) at 450.

Returning to decision 425 and decision 435 if either a proximity sensor is not used by the system (decision 425 branching to the "no" branch), or the user is in proximity to the device (decision 435 branching to the "yes" branch), then a decision is made as to whether the current volume is greater than or equal to the final volume level (decision 455). If the current volume is greater than or equal to the final volume level, then decision 455 branches to the "yes" branch whereupon, at step 460, the event (audio request) is played at the final volume level and processing returns to the calling routine (see FIG. 3) at 465. On the other hand, if the current volume level is less than the final volume level, then decision 455 branches to the "no" branch whereupon, at step 470, the current volume level is increased according to the volume ramp setting and the new (adjusted) current volume level is stored in current volume memory area 420. At step 475, the event (audio request) is played at the increased volume level and processing returns to the calling routine (see FIG. 3) at 480.

Figure 5:
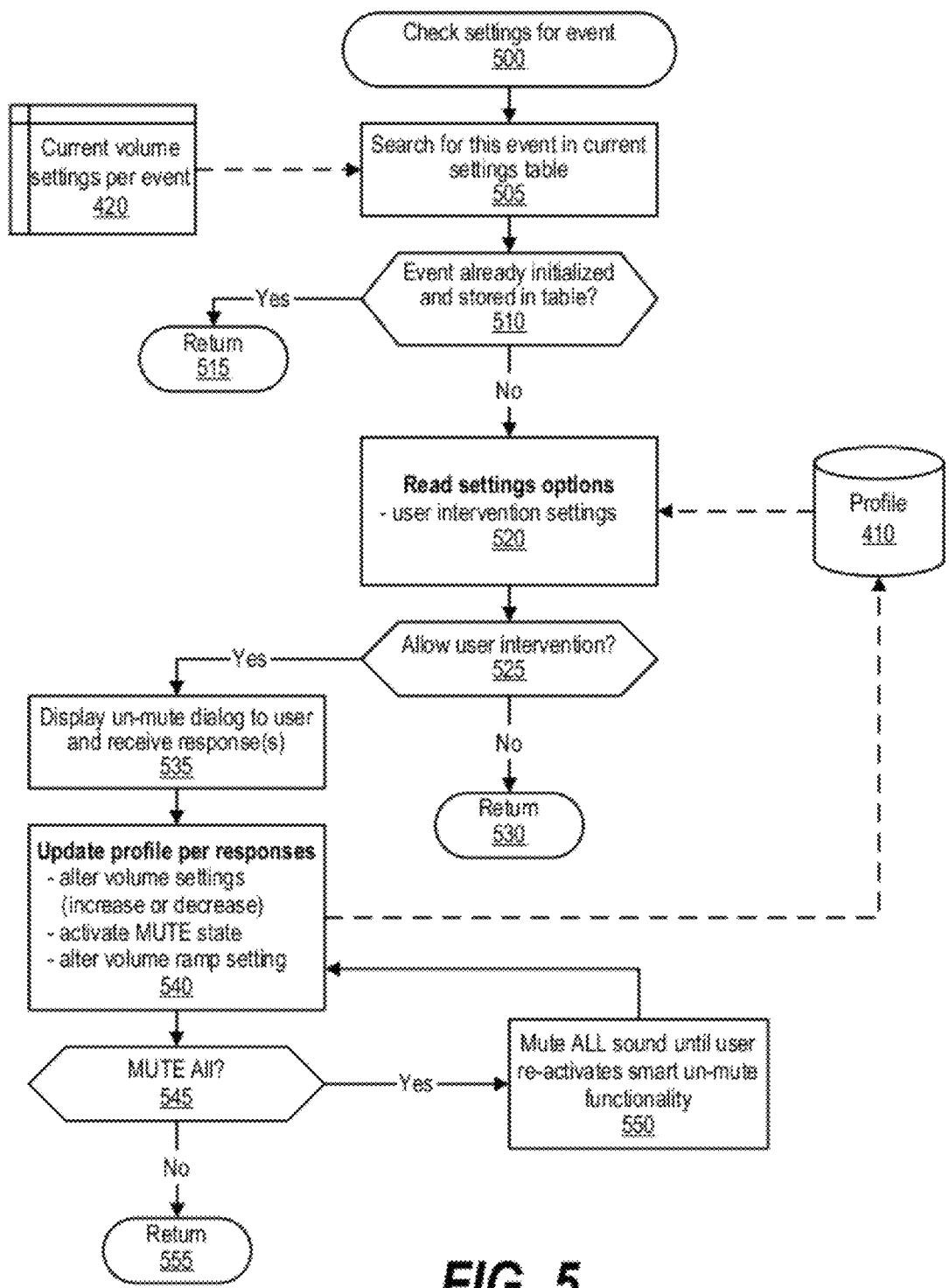
FIG. 5 is a flowchart showing steps taken to check audio settings for an event from an audio requestor shown in FIG. 4.

FIG. 5 is a flowchart showing steps taken to check audio settings for an event from an audio requestor shown in FIG. 4. This routine is called by predefined process 415 shown in FIG. 4. In FIG. 5, processing commences at 500 whereupon, at step 505, current volume settings memory area 420 is searched for the current settings corresponding to this event (request source). A decision is made as to whether the event (request source) has already been initialized and stored in memory area 420 (decision 510). If the event (request source) was found in memory area 420, then decision 510 branches to the "yes" branch whereupon processing returns to the calling routine (see FIG. 4) at 515. On the other hand, if the request source has not yet been initialized, then decision 510 branches to the "no" branch for initialization processing. At step 520, user-defined settings are read from profile 410. One type of user-defined settings are user intervention settings. A decision is made as to whether user intervention is allowed (decision 525). If user intervention is not allowed with the request source, then decision 525 branches to the "no" branch whereupon processing returns to the calling routine (see FIG. 4) at 530. On the other hand, if user intervention is allowed, then decision 525 branches to the "yes" branch whereupon, at step 535 an un-mute dialog is displayed to the user and the user can interact with the dialog to make various un-mute selections. At step 540, any alterations made to the profile are stored in profile data store 410. These alterations may be to the volume ramp setting, the final volume level for one or more audio request sources, the intermediate volume level for one or more audio request sources, and to activate a MUTE state. A decision is made as to whether the user has requested to temporarily mute all sources (decision 545). For example, while various applications are in un-muted states at various volume levels, someone may walk into the user's office at which time the user may want to mute all sounds for a period of time. If the user has selected to mute all sound, then decision 545 branches to the "yes" branch whereupon, at step 550, all sound is muted until the user re-activates smart un-mute functionality. This continues until the user re-activates the smart un-mute functionality, at which point decision 545 branches to the "no" branch whereupon processing returns to the calling routine (see FIG. 4) at 555.

Figure 6:
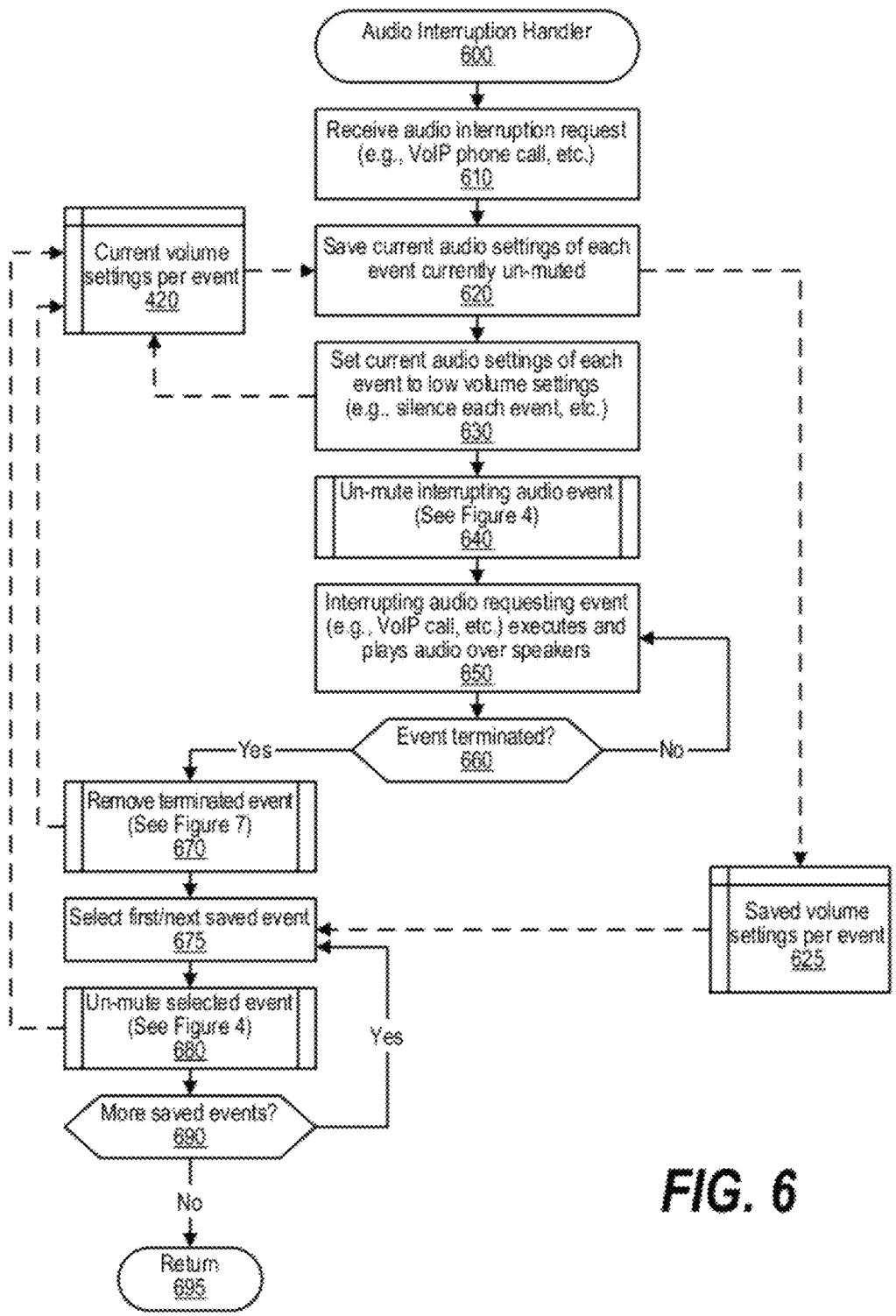
FIG. 6 is a flowchart showing steps taken to handle an audio interruption by a requestor that is intended to be the sole audio source.

FIG. 6 is a flowchart showing steps taken to handle an audio interruption by a requestor that is intended to be the sole audio source. This routine is called by predefined process 360 shown in FIG. 3. In FIG. 6, processing commences at 600 whereupon, at step 610, an audio interruption source is identified such as a VoIP session, etc. At step 620, the current audio settings (volume levels, etc.) are read from current volume settings memory area 420 and saved in saved volume settings memory area 625. At step 630, the current audio setting of each previously established request source is set to a low, i.e., muted volume level. As used herein, a muted level is a low level or a zero level consistent with muting. At predefined process 640, the request source that has been identified as interrupting other audio sources is un-muted (see FIG. 4 and corresponding text for processing details). At step 650, the interrupting request source, such as a VoIP application, etc., executes and plays audio over the system's audio output (e.g., speakers). A decision is made as to whether the interrupting audio request source, such as the VoIP application, has terminated (decision 660). If the event has not terminated, then decision 660 continues to branch to the "no" branch which loops back to step 650 to continue processing the interrupting audio request source. This looping continues until the interrupting audio request source has terminated, at which point decision 660 branches to the "yes" branch.

Figure 7:
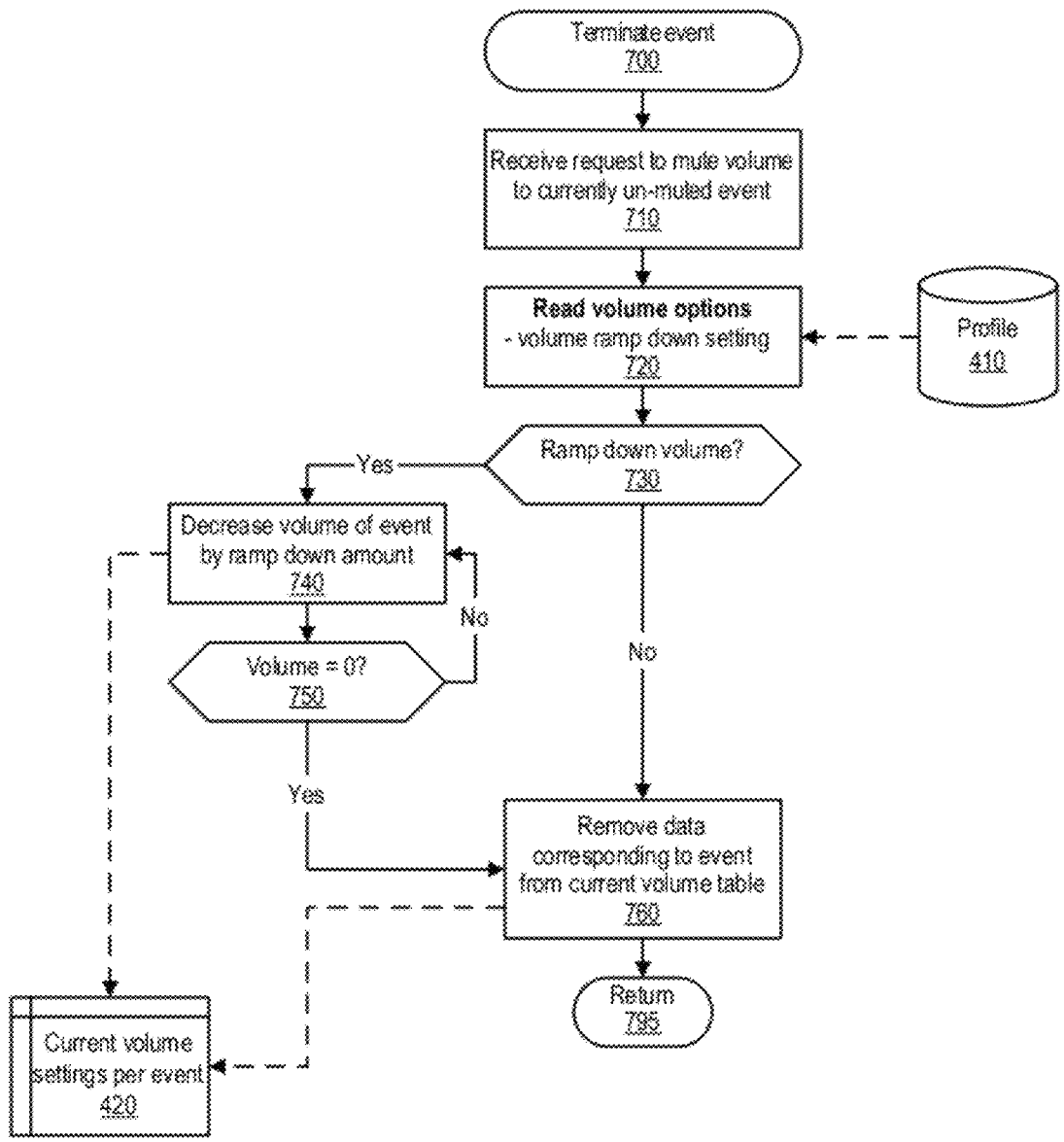
FIG. 7 is a flowchart showing steps taken when an audio source or event is terminated.

At predefined process 670, the terminated audio request source is deleted from memory area 420 (see FIG. 7 and corresponding text for processing details). At step 675, the first request source previously saved to saved volume settings memory area 625 is selected. At predefined process 680, the selected request source is un-muted (see FIG. 4 and corresponding text for processing details). A decision is made as to whether there are more saved request sources to process (decision 690). If there are more request sources to process, then decision 690 branches to the "yes" branch which loops back to select the next saved request source and un-mute it using predefined process 680. This looping continues until all saved request sources have been un-muted, at which point decision 690 branches to the "no" branch and processing returns to the calling routine (see FIG. 4) at 695.

FIG. 7 is a flowchart showing steps taken when an audio source or event is terminated. Processing commences at 700 whereupon, at step 710, a request is received to mute the volume of a currently un-muted request source that has been terminated. In one embodiment, at step 720, a volume ramp down setting is received from profile 410. A decision is made as to whether the volume (e.g. for buffered sound requests from the terminated request source, etc.) is to be ramped down (decision 730). If the volume is to be ramped down, then decision 730 branches to the "yes" branch whereupon, at step 740, the volume for the request source that is being terminated is ramped down according to the ramp down setting and the new (lower) volume is stored in current volume memory area 420. A decision is made as to whether the volume has been lowered to zero (decision 750). If the volume has not yet been lowered to zero, then decision 750 branches to the "no" branch which loops back to continue decreasing the volume level by the ramp down amount. This looping continues until the volume has been decreased to zero, at which time decision 750 branches to the "yes" branch.

After the volume has been decreased to zero (decision 750 branching to the "yes" branch) or if the volume is not being ramped down (decision 730 branching to the "no" branch), then at step 760, the data stored in current volume memory area 420 that corresponds to the request source that is being terminated is removed (deleted) from the memory area. Processing then returns to the calling routine at 795.

Figure 8:
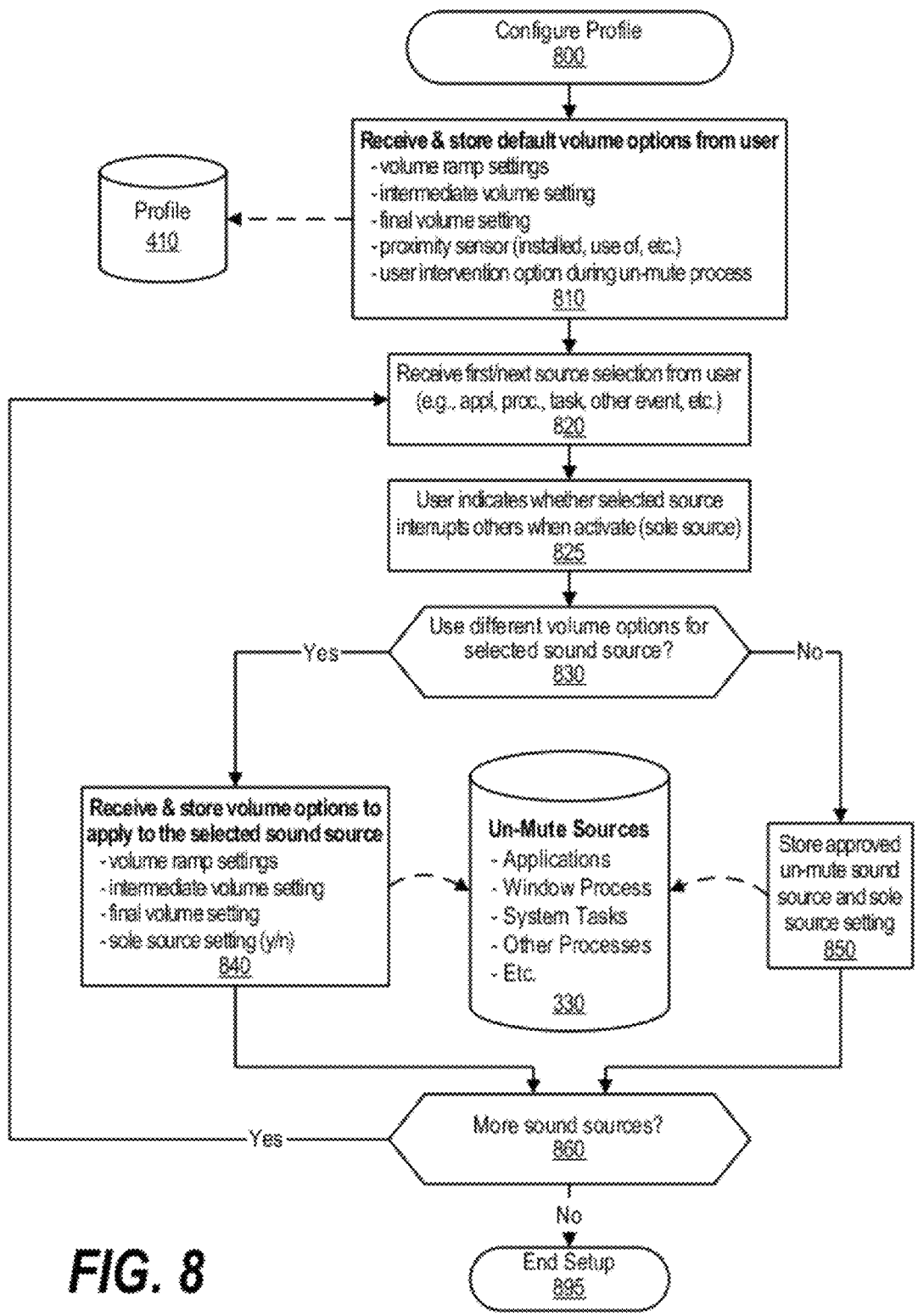
FIG. 8 is a flowchart showing setup steps taken to configure a profile used in the smart un-muting of system sounds.

FIG. 8 is a flowchart showing setup steps taken to configure a profile used in the smart un-muting of system sounds. Processing commences at 800 whereupon, at step 810, the system receives default volume options from the user and stores the options in profile data store 410. The default volume options include the volume ramp settings, the intermediate volume setting, the final volume setting, proximity sensor data, and user intervention options. At step 820, the system receives the first request source selection from the user. The request source might be an application program, a process, a system task, or other event that requests audio functions. At step 825, the user indicates whether the request source interrupts other audio request sources in order to have sole access to the system's audio output. An interrupting request source might be a VoIP application, etc. A decision is made as to whether different volume options should be used for the selected request source (decision 830). If different volume options are to be used for the selected request source, then decision 830 branches to the "yes" branch whereupon, at step 840, the volume options corresponding to the selected request source are received from the user. These volume options may include the volume ramp settings, the intermediate volume setting, the final volume setting, proximity sensor data, and user intervention options. The volume options particular to the selected request source are stored in un-mute sources data store 330 along with an identifier of the selected request source as well as an indicator as to whether the request source is an interrupting (sole) request source. On the other hand, if different volume options are not to be used with the selected request source, then decision 830 branches to the "no" branch whereupon, at step 850, the identifier of the selected request source is stored in un-mute data store 330 along with an indicator as to whether the request source is an interrupting (sole) request source. A decision is made as to whether there are more request sources to be included in the list of un-mute request sources stored in data store 330 (decision 860). If there are more sources to process, then decision 860 branches to the "yes" branch which loops back to receive data pertaining to the next request source to include in data store 330. This looping continues until all of the desired request sources have been processed, at which point decision 860 branches to the "no" branch and setup processing ends at 895.

One of the intended implementations is a software application, namely, a set of instructions (program code) or other functional descriptive material in a code module that may, for example, be resident in the random access memory of the computer. Until required by the computer, the set of instructions may be stored in another computer memory, for example, in a hard disk drive, or in a removable memory such as an optical disk (for eventual use in a CD ROM) or floppy disk (for eventual use in a floppy disk drive). Thus, embodiments may be implemented as a computer program product for use in a computer. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps. Functional descriptive material is information that imparts functionality to a machine. Functional descriptive material includes, but is not limited to, computer programs, instructions, rules, facts, definitions of computable functions, objects, and data structures.

While particular embodiments have been shown and described, it will be obvious to those skilled in the art that, based upon the teachings herein, that changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. A method, comprising:
   receiving an audio request from a request source while a machine is in a muted state;
   comparing, using a processor, the request source with a list in one or more tin-mute sources;
   playing audio associated with the audio request in response to the comparison revealing that the request source is in the list of un-mute sources; and
   in response to a machine shutdown signal, un-muting all sources in the list.

2. The method of claim 1, further comprising:
   identifying that the request source interrupts, one or more other un-muted audio sources;
   based on the identification, muting the other un-muted audio sources;
   receiving a signal that the request source is inactive; and
   un-muting the muted audio sources in response to receiving the signal.

3. The method of claim wherein the playing includes gradually increasing a volume level from a muted level to a higher user-specified level over a period of time, and wherein the playing further comprises:
   retrieving a user-specified volume ramp setting, wherein the gradual increase of the volume level is performed at the retrieved user-specified volume ramp setting.

4. The method of claim 1 further comprising:
   receiving a request to mute the audio request from the request source, wherein the mute request is received after the audio request; and
   gradually decreasing the volume level from a user-specified level to a muted level over a period of time.

5. The method of claim 1 further comprising:
   determining that a user is outside a proximity of the machine, the determination made using a proximity sensor accessible to the machine; and
   identifying an intermediate volume level that is less than a user-specified full volume level in response to the determination, wherein the playing is performed at the identified intermediate volume level.

6. The method of claim 5 further comprising:
   detecting that the user has moved within the proximity of the machine; and
   gradually increasing the volume of the playing of the audio request from the intermediate volume level to the user-specified full volume level in response to the detecting.

7. The method of claim 1, wherein the list is stored in non-volatile memory of the machine.

8. The method of claim 1, wherein the list is stored in a hard disk drive of the machine.

9. An information handling system comprising:
   one or more processors;
   a non-volatile memory accessible by at least one of the processors;
   an audio output device accessible by at least one of the processors, wherein the audio output device plays audible signals based on data stored in the non-volatile memory;
   one or more audio request sources executable by one or more of the processors;
   a database of one or more un-mute sources stored in the non-volatile memory;
   a set of instructions stored in the non-volatile memory and executable by at least one of the processors to;
   receive, an audio request from a request source while the information handling system is in a muted state;
   compare the request source against the database of one or more un-mute sources;
   play audio associated with the audio request in response to a determination based on the comparison that the audio request from the request source is indicated in the database of one or more un-mute sources; and
   in response to initiation of a shutdown of the information handling system, un-mute all sources Indicated in the database.

10. The information handling system of claim 9 wherein the instructions are further executable to:
    identify that the request source Interrupts one or more previously un-muted audio sources;
    based on the identification, mute the previously un-muted audio sources;
    receive a signal that the request source is inactive; and
    un-mute the muted audio sources in response to receiving the signal.

11. The information handling system of claim 9 wherein the instructions are further executable to:
    determine that a user is outside a proximity of the information handling system, the determination made using a proximity sensor accessible to the information handling system; and
    identify an intermediate volume level that is less than a user-specified full volume level in response to the determination, wherein the playing is executed at the identified intermediate volume level.

12. The information handling system of claim 11 wherein the instructions are further executable to:
    detect that the user has moved within the proximity of the information handling system; and
    gradually increase a volume of the playing of the audio request from the intermediate volume level to the user-specified full volume level in response to the detection.

13. The information handling system of claim 9, wherein the non-volatile memory is at least one hard disk drive.

14. A computer program product stored in a computer readable storage medium that is not a carrier wave comprising instructions executable by an information handling system to:
    receive an audio request from a request source while the information handling system is in a muted state;
    access a profile which indicates one or more mute Sources and one or more un-mute sources and determine whether the request source is indicated in the profile as being a mute source or an un-mute source;
    play audio associated with the audio request in response to a determination that the request source is indicated in the profile as being an un-mute source; and
    in response to a signal to shut down the information handling system, un-mute all sources in the profile.

15. The computer program product of claim 14 wherein the instructions are further executable to:
    identity that the request source interrupts one or more un-muted audio sources;

based on the identification, mute other un-muted audio sources;

receive a signal that the request source is inactive; and un-mute muted audio sources in response to receiving the signal.

16. The computer program product of claim 14 wherein the playing includes gradually increasing a volume level from a muted level to a higher user-specified level over a first period of time, and wherein the playing includes additional actions comprising:

retrieval of in user-specified volume ramp setting, wherein the gradual increase of the volume level is executed at the retrieved user-specified volume ramp setting;

receipt of a request to mute the audio request from the request source, wherein the mute request is received after the audio request; and gradual decrease of the volume level from the user-specified level to a muted level over a second period of time.

17. The computer program product of claim 16, wherein the muted level is greater than zero.

18. The computer program product of claim 14 wherein the instructions are further executable to:

determine that user is outside a proximity of the information handling system, the determination made using a proximity sensor accessible to the information handling system; and identify an intermediate volume level that is less than a user-specified full volume level in response to the determination, wherein the playing is executed at the identified intermediate volume level.

19. The computer program product of claim 18 wherein the instructions are further executable to:

detect that the user has moved within the proximity of the information handling system; and gradually increase a volume of the playing of the audio request from the intermediate volume level to the user-specified full volume level in response to the detection.

20. The computer program product of claim 14, wherein the profile is stored in non-volatile memory of the information handling system.

\* \* \* \* \*